US010264716B2

(12) United States Patent
Hong et al.

(10) Patent No.: US 10,264,716 B2
(45) Date of Patent: Apr. 16, 2019

(54) OUTDOOR DISPLAY SCREEN AND COMMUNICATIONS DEVICE

(71) Applicant: Huawei Technologies Co., Ltd., Shenzhen (CN)

(72) Inventors: Yaqin Hong, Shenzhen (CN); Zhiwen Yang, Shenzhen (CN); Bingduo Yan, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/676,055

(22) Filed: Aug. 14, 2017

(65) Prior Publication Data

US 2017/0345346 A1 Nov. 30, 2017

Related U.S. Application Data

(63) Continuation of application No. PCT/CN2015/086971, filed on Aug. 14, 2015.

(30) Foreign Application Priority Data

Feb. 13, 2015 (CN) .......................... 2015 1 0080974

(51) Int. Cl.
*H05K 7/20* (2006.01)
*F24F 12/00* (2006.01)
(Continued)

(52) U.S. Cl.
CPC ....... *H05K 7/20972* (2013.01); *F24F 12/006* (2013.01); *G09F 9/30* (2013.01);
(Continued)

(58) Field of Classification Search
CPC .................... H05K 7/20954–7/20972; H05K 7/20136–7/20145; F21V 29/50; H04Q 1/035
(Continued)

(56) References Cited

U.S. PATENT DOCUMENTS 8,471,997 B2 * 6/2013 Yang ................. G02F 1/133385
349/161
8,472,174 B2 * 6/2013 Idems ...................... G09F 9/30
361/679.21
(Continued)

FOREIGN PATENT DOCUMENTS

CN 1921256 A 2/2007
CN 201600846 U 10/2010
(Continued)

OTHER PUBLICATIONS

Machine Translation and Abstract of European Publication No. EP1951020, Jul. 30, 2008, 11 pages.
(Continued)

*Primary Examiner* — Zachary Pape
(74) *Attorney, Agent, or Firm* — Conley Rose, P.C.

(57) ABSTRACT

An outdoor display screen includes a housing, a display screen, a control module, a heat dissipation module, and a power supply component. A first cavity and a second cavity are disposed on the housing. The display screen, the control module, and the power supply component are mounted in the first cavity, and the heat dissipation module is mounted in the second cavity. A cable-through hole is disposed on the housing. An air exhaust vent connected to an air intake vent of an internal circulation path and an air intake vent connected to an air exhaust vent of the internal circulation path are disposed in the first cavity to form an internal circulation heat-dissipation air duct. An air intake vent and an air exhaust vent are disposed in the second cavity to form an external circulation heat-dissipation air duct.

20 Claims, 5 Drawing Sheets

(51) Int. Cl.
*G09F 19/22* (2006.01)
*F21V 29/50* (2015.01)
*G09F 9/30* (2006.01)

(52) U.S. Cl.
CPC .............. *G09F 19/22* (2013.01); *H05K 7/20* (2013.01); *F21V 29/50* (2015.01); *H05K 7/202* (2013.01); *H05K 7/20145* (2013.01)

(58) Field of Classification Search
USPC .................... 361/695–697; 165/80.1–80.3
See application file for complete search history.

(56) References Cited

U.S. PATENT DOCUMENTS

| | | | |
|---|---|---|---|
| 8,605,436 B2 | 12/2013 | Kamei et al. | |
| 8,693,185 B2* | 4/2014 | Dunn | G02F 1/133385 165/80.3 |
| 9,173,325 B2* | 10/2015 | Dunn | H05K 7/20154 |
| 2007/0047167 A1 | 3/2007 | Fu et al. | |
| 2014/0334100 A1* | 11/2014 | Yoon | H05K 7/20145 361/692 |

FOREIGN PATENT DOCUMENTS

| | | |
|---|---|---|
| CN | 201805656 U | 4/2011 |
| CN | 203276422 U | 11/2013 |
| CN | 203378203 U | 1/2014 |
| CN | 103582385 A | 2/2014 |
| CN | 103615641 A | 3/2014 |
| CN | 203838988 U | 9/2014 |
| CN | 104143295 A | 11/2014 |
| CN | 203982721 U | 12/2014 |
| CN | 204102496 U | 1/2015 |
| CN | 104684363 A | 6/2015 |
| EP | 1951020 A1 * | 7/2008 ......... H05K 7/20972 |
| KR | 20090116368 A | 11/2009 |
| WO | 2007116116 A1 | 10/2007 |
| WO | 2009135308 A1 | 11/2009 |

OTHER PUBLICATIONS

Foreign Communication From a Counterpart Application, European Application No. 15881770.0, Extended European Search Report dated Jan. 4, 2018, 10 pages.
Machine Translation and Abstract of Chinese Publication No. CN203378203, Jan. 1, 2014, 6 pages.
Machine Translation and Abstract of Chinese Publication No. CN103582385, Feb. 12, 2014, 20 pages.
Machine Translation and Abstract of Chinese Publication No. CN103615641, Mar. 5, 2014, 6 pages.
Machine Translation and Abstract of Chinese Publication No. CN104684363, Jun. 3, 2015, 18 pages.
Machine Translation and Abstract of Chinese Publication No. CN201600846, Oct. 6, 2010, 9 pages.
Machine Translation and Abstract of Chinese Publication No. CN201805656, Apr. 20, 2011, 9 pages.
Machine Translation and Abstract of Chinese Publication No. CN203276422, Nov. 6, 2013, 9 pages.
Machine Translation and Abstract of Korean Publication No. KR20090116368, Nov. 11, 2009, 16 pages.
Foreign Communication From a Counterpart Application, PCT Application No. PCT/CN2015/086971, English Translation of International Search Report dated Nov. 6, 2015, 2 pages.
Foreign Communication From a Counterpart Application, PCT Application No. PCT/CN2015/086971, English Translation of Written Opinion dated Nov. 6, 2015, 6 pages.

* cited by examiner

OUTDOOR DISPLAY SCREEN AND COMMUNICATIONS DEVICE

CROSS-REFERENCE TO RELATED APPLICATIONS

This application is a continuation of International Patent Application No. PCT/CN2015/086971 filed on Aug. 14, 2015, which claims priority to Chinese Patent Application No. 201510080974.X filed on Feb. 13, 2015. The disclosures of the aforementioned applications are hereby incorporated by reference in their entireties.

TECHNICAL FIELD

The present application relates to the field of outdoor display technologies, and in particular, to an outdoor display screen and a communications device.

BACKGROUND

In the field of outdoor display technologies, an outdoor display screen needs to be disposed in a densely populated area for advertising.

In some other approaches, an outdoor display screen is generally mounted using an independent cabinet, or an outdoor display screen is disposed by means of integration with a bus station, a roadside convenience store, a newsstand, or the like in order to present an electronic advertisement.

However, when the outdoor display screen is disposed in the foregoing manners, an alternating current (AC) power supply and a communications channel need to be specially designed for the outdoor display screen. Consequently, during on-site mounting, complex engineering construction needs to be performed, such as a concrete foundation, pipeline cabling, and mounting and fixation, and it is difficult to complete construction for disposing the outdoor display screen.

Therefore, how to reduce construction difficulty in disposing the outdoor display screen is a technical problem to be resolved by a person skilled in the art.

SUMMARY

The present application provides an outdoor display screen based on a communications device and the communications device. The outdoor display screen directly uses resources in the communications device, such as a power line and a communications fiber, thereby reducing construction difficulty in disposing the outdoor display screen.

According to a first aspect, an outdoor display screen is provided, including a housing, a display screen, a control module, a heat dissipation module, and a power supply component, where the housing is mounted on an enclosure of a communications device, and a first cavity and a second cavity are disposed on the housing. the display screen, the control module, and the power supply component are mounted in the first cavity, a display window opposite to an out-light surface of the display screen is disposed on the housing, and protection glass is disposed on the display window, the heat dissipation module is mounted in the second cavity to form, in the second cavity, an internal circulation path and an external circulation path that are separated from each other, and a cable-through hole used by a power cable and a communications cable to pass through to enable the display screen, the control module, and the power supply component to be connected to a power interface and a communications interface in the enclosure of the communications device is disposed on the housing, and an air exhaust vent connected to an air intake vent of the internal circulation path and an air intake vent connected to an air exhaust vent of the internal circulation path are disposed in the first cavity to form an internal circulation heat-dissipation air duct, and an air intake vent and an air exhaust vent that are connected to the external circulation path and an external environment are disposed in the second cavity to form an external circulation heat-dissipation air duct separated from the internal circulation heat-dissipation air duct.

With reference to the first aspect, in a first possible implementation manner, the outdoor display screen further includes an internal circulation fan set mounted in the internal circulation heat-dissipation air duct and an external circulation fan set mounted in the external circulation heat-dissipation air duct.

With reference to the first aspect, in a second possible implementation manner, a ventilation gap exists between the display screen and the protection glass, and a ventilation gap exists between a side that is of the display screen and that is away from the protection glass and a cavity wall that is of the first cavity and that is opposite to the side.

With reference to the first aspect, in a third possible implementation manner, the housing includes a front cover, a baseplate, and a spacer, where the front cover and the baseplate are combined to form an internal cavity, and the spacer is located in the internal cavity to separate space of the internal cavity into the first cavity and the second cavity, and the heat dissipation module, the baseplate, and the spacer are combined to form the internal circulation path and the external circulation path.

With reference to the third possible implementation manner of the first aspect, in a fourth possible implementation manner, the baseplate is mounted on the front cover and may flip around a side of the baseplate.

With reference to the fourth possible implementation manner of the first aspect, in a fifth possible implementation manner, the spacer includes a first sub-spacer mounted on the front cover and a second sub-spacer mounted on the baseplate. The display screen is mounted on the first sub-spacer, the control module is mounted on a side that is of the display screen and that faces the baseplate, and the power supply component is mounted on the baseplate. The display screen, the control module, and the power supply component are exposed when the baseplate is opened by flipping around the side of the baseplate, and the first sub-spacer and the second sub-spacer are combined to separate the space of the internal cavity formed by closing the front cover and the baseplate in order to form the first cavity and the second cavity when the baseplate and the front cover are closed.

With reference to the fifth possible implementation manner of the first aspect, in a sixth possible implementation manner, the first cavity is located on a side that is of the heat dissipation module and that is away from the baseplate, and in the second cavity the external circulation path exists on a side that is of the heat dissipation module and that faces the baseplate, and the internal circulation path exists on the side that is of the heat dissipation module and that is away from the baseplate.

With reference to the sixth possible implementation manner of the first aspect, in a seventh possible implementation manner, the first cavity is enclosed by the first sub-spacer, the second sub-spacer, the front cover, and the baseplate, and the second cavity is enclosed by the first sub-spacer, the second sub-spacer, the front cover, and the baseplate.

With reference to the seventh possible implementation manner of the first aspect, in an eighth possible implementation manner, the air exhaust vent disposed in the second cavity is located on the front cover, and the air intake vent disposed in the second cavity is located on the baseplate.

With reference to the eighth possible implementation manner of the first aspect, in a ninth possible implementation manner, the baseplate protrudes into a surrounding area of the front cover to form an edge part of a ventilation gap between the baseplate and the enclosure of the communications device, and an air vent penetrating a metal sheet of the edge part to connect the external environment and the ventilation gap between the baseplate and the enclosure of the communications device is disposed on the edge part.

With reference to the ninth possible implementation manner of the first aspect, in a tenth possible implementation manner, a wind separation component is disposed on a side that is of the baseplate and that is away from the display screen, the wind separation component is configured to separate an air intake vent and an air exhaust vent that are disposed on the enclosure of the communications device, and the air intake vent disposed on the baseplate and the air intake vent disposed on the enclosure of the communications device are located on a same side of the wind separation component.

With reference to the first aspect, the first possible implementation manner of the first aspect, the second possible implementation manner of the first aspect, the third possible implementation manner of the first aspect, the fourth possible implementation manner of the first aspect, the fifth possible implementation manner of the first aspect, the sixth possible implementation manner of the first aspect, the seventh possible implementation manner of the first aspect, the eighth possible implementation manner of the first aspect, the ninth possible implementation manner of the first aspect, or the tenth possible implementation manner of the first aspect, in an eleventh possible implementation manner, the heat dissipation module is a heat exchange fin, and a surrounding area of the heat exchange fin and a cavity wall of the second cavity are combined and sealed to separate internal space of the second cavity into the internal circulation path and the external circulation path.

With reference to the first aspect, the first possible implementation manner of the first aspect, the second possible implementation manner of the first aspect, the third possible implementation manner of the first aspect, the fourth possible implementation manner of the first aspect, the fifth possible implementation manner of the first aspect, the sixth possible implementation manner of the first aspect, the seventh possible implementation manner of the first aspect, the eighth possible implementation manner of the first aspect, the ninth possible implementation manner of the first aspect, or the tenth possible implementation manner of the first aspect, in a twelfth possible implementation manner, on two opposite and parallel sides of the housing, a hinge configured to hinge the enclosure of the communications device is disposed on one side, and a lock-up mechanism configured to lock the enclosure of the communications device is disposed on the other side.

With reference to the first aspect, the first possible implementation manner of the first aspect, the second possible implementation manner of the first aspect, the third possible implementation manner of the first aspect, the fourth possible implementation manner of the first aspect, the fifth possible implementation manner of the first aspect, the sixth possible implementation manner of the first aspect, the seventh possible implementation manner of the first aspect, the eighth possible implementation manner of the first aspect, the ninth possible implementation manner of the first aspect, or the tenth possible implementation manner of the first aspect, in a thirteenth possible implementation manner, the housing is fixed on the enclosure of the communications device.

According to a second aspect, a communications device is provided, including an enclosure, a power distribution component, a communications component, and a heat dissipation system, where the power distribution component, the communications component, and the heat dissipation system are located in the enclosure, and further including any outdoor display screen that is provided in the foregoing technical solutions, located on an outer side of the enclosure, and integrated with the enclosure.

With reference to the outdoor display screen provided in the first aspect and the communications device provided in the second aspect, in the outdoor display screen, a first cavity and a second cavity are formed inside a housing, an air exhaust vent and an air intake vent are disposed in the first cavity to form, together with an internal circulation path formed by combining the second cavity and a heat dissipation module, an internal circulation heat-dissipation air duct, and an air intake vent and an air exhaust vent that are connected to an external circulation path and an external environment are disposed in the second cavity to form an external circulation heat-dissipation air duct separated from the internal circulation heat-dissipation air duct. The internal circulation heat-dissipation air duct is separated from the external circulation heat-dissipation air duct. Therefore, isolation such as water-proofing, dust-proofing, and debris-proofing can be implemented on the internal circulation heat-dissipation air duct. An independent heat dissipation system is formed in the outdoor display screen, and when being integrated with an enclosure of the communications device, the heat dissipation system may not be mixed with an existing heat dissipation system of the communications device. Therefore, negative impact caused by the outdoor display screen on the communications device is relatively low. In addition, in the outdoor display screen, a cable-through hole is disposed on the housing. Therefore, when the outdoor display screen is integrated with the enclosure of the communications device, power supply and signal transmission can be implemented using a cable and using a power interface and a communications interface that are disposed in the enclosure of the communications device, and no additional line needs to be disposed, or signal transmission can be implemented by directly using a pipeline cable inside the communications device and a pipeline cable in a concrete foundation disposed during mounting of the communications device. A mounting operation is simple, and a construction difficulty in disposing the outdoor display screen is reduced.

BRIEF DESCRIPTION OF DRAWINGS

To describe the technical solutions in the embodiments of the present application more clearly, the following briefly describes the accompanying drawings required for describing the embodiments. The accompanying drawings in the following description show merely some embodiments of the present application, and a person of ordinary skill in the art may still derive other drawings from these accompanying drawings without creative efforts.

DESCRIPTION OF EMBODIMENTS

The following clearly describes the technical solutions in the embodiments of the present application with reference to the accompanying drawings in the embodiments of the present application. The described embodiments are merely some but not all of the embodiments of the present application. All other embodiments obtained by a person of ordinary skill in the art based on the embodiments of the present application without creative efforts shall fall within the protection scope of the present application.

Figure 1:
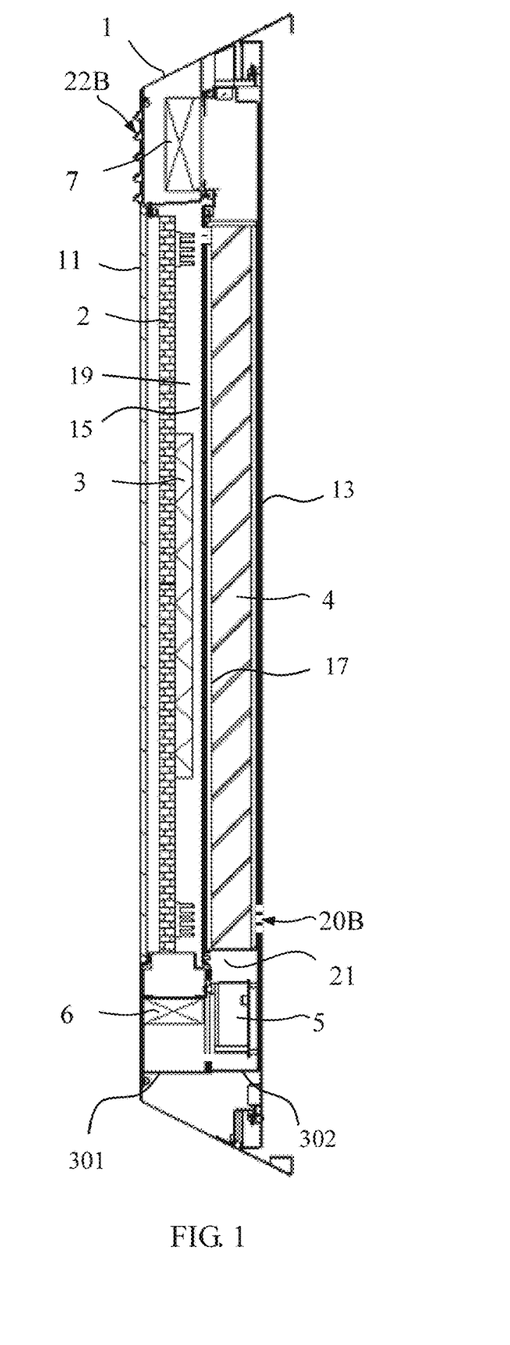
FIG. 1 is a schematic structural diagram of an outdoor display screen according to an embodiment of the present application.
Figure 2:
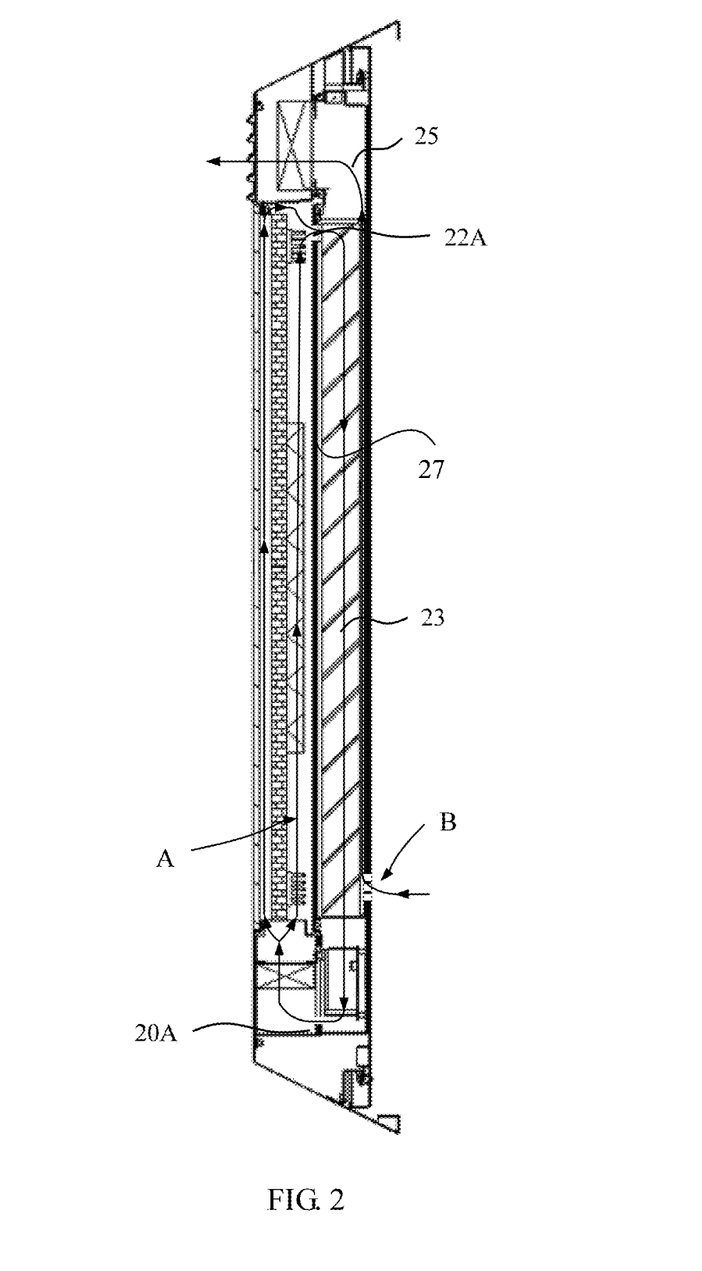
FIG. 2 is a schematic principle diagram of an internal circulation heat-dissipation air duct and an external circulation heat-dissipation air duct in an outdoor display screen with the structure shown in FIG. 1.
Figure 3:
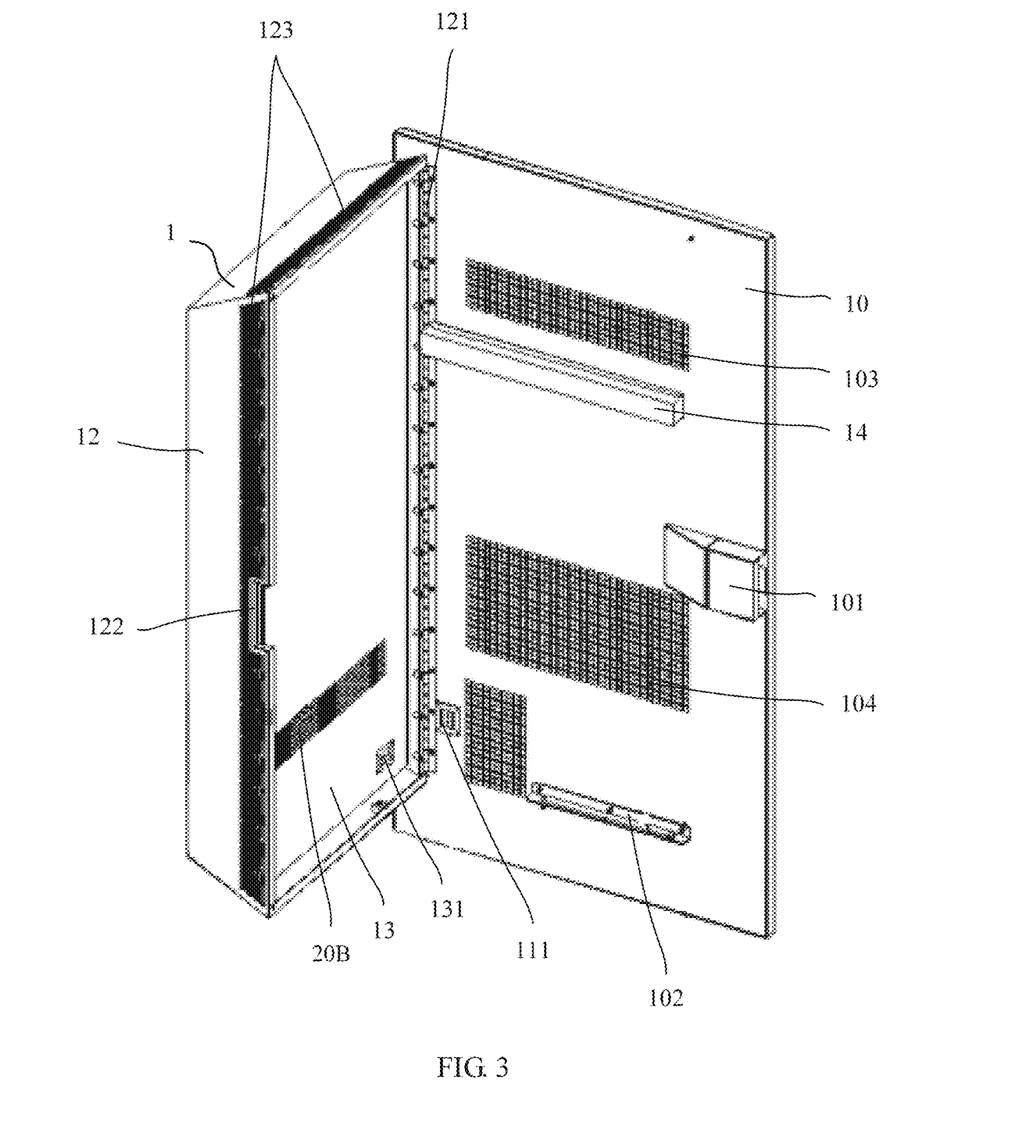
FIG. 3 is a schematic structural diagram of an outdoor display screen integrated with an enclosure of a communications device according to an embodiment of the present application.

Referring to FIG. 1, FIG. 2, and FIG. 3, FIG. 1 is a schematic structural diagram of an outdoor display screen according to an embodiment of the present application, FIG. 2 is a schematic principle diagram of an internal circulation heat-dissipation air duct and an external circulation heat-dissipation air duct in an outdoor display screen with the structure shown in FIG. 1, and FIG. 3 is a schematic structural diagram of an outdoor display screen integrated with an enclosure of a communications device according to an embodiment of the present application.

As shown in FIG. 1, the outdoor display screen provided in this embodiment includes a housing 1, a display screen 2, a control module 3, a heat dissipation module 4, and a power supply component 5.

The housing 1 is mounted on an enclosure 10 of a communications device, and a first cavity 19 and a second cavity 21 are disposed on the housing 1. The display screen 2, the control module 3, and the power supply component 5 are mounted in the first cavity. A display window opposite to an out-light surface of the display screen 2 is disposed on the housing 1, and protection glass 11 is disposed on the display window. The heat dissipation module 4 is mounted in the second cavity 21 to form, in the second cavity 21, an internal circulation path 23 (FIG. 2) and an external circulation path 25 (FIG. 2) that are separated from each other. As shown in FIG. 3, a cable-through hole 131 used by a power cable and a communications cable to pass through to enable the display screen 2, the control module 3, and the power supply component 5 to be connected to a power interface and a communications interface in the enclosure 10 of the communications device is disposed on the housing 1.

An air exhaust vent 22A connected to an air intake vent 20A of the internal circulation path and an air intake vent 20A connected to an air exhaust vent 22A of the internal circulation path 23 are disposed in the first cavity 19 to form an internal circulation heat-dissipation air duct A shown in FIG. 2. An air intake vent 20B and an air exhaust vent 22B that are connected to the external circulation path 25 and an external environment are disposed in the second cavity 21 to form an external circulation heat-dissipation air duct B. The internal circulation heat-dissipation air duct A is separated from the external circulation heat-dissipation air duct B.

In the outdoor display screen, a first cavity 19 and a second cavity 21 are formed inside a housing 1, an air exhaust vent 22A and an air intake vent 20A are disposed in the first cavity 19 to form, together with an internal circulation path 23 formed by combining the second cavity 21 and a heat dissipation module 4, an internal circulation heat-dissipation air duct A, and an air intake vent 20B and an air exhaust vent 22B that are connected to an external circulation path 25 are disposed in the second cavity 21 to form an external circulation heat-dissipation air duct B separated from the internal circulation heat-dissipation air duct A. The internal circulation heat-dissipation air duct A is separated from the external circulation heat-dissipation air duct B. Therefore, isolation such as water-proofing, dust-proofing, and debris-proofing can be implemented on the internal circulation heat-dissipation air duct A. An independent heat dissipation system is formed in the outdoor display screen, and when being integrated with an enclosure 10 of a communications device, the heat dissipation system may not be mixed with an existing heat dissipation system of the communications device. Therefore, negative impact caused by the outdoor display screen on the communications device is relatively low. In addition, in the outdoor display screen, a cable-through hole 131 is disposed on the housing 1. Therefore, when the outdoor display screen is integrated with the enclosure 10 of the communications device, power supply and signal transmission can be implemented using a cable and using a power interface and a communications interface that are disposed in the communications device, and no additional line needs to be disposed. A mounting operation is simple, and a construction difficulty in disposing the outdoor display screen is reduced.

In an embodiment, for ease of restricting a direction of an air flow in the internal circulation heat-dissipation air duct A and a direction of an air flow in the external circulation heat-dissipation air duct B, the outdoor display screen further includes an internal circulation fan set 6 mounted in the internal circulation heat-dissipation air duct A and an external circulation fan set 7 mounted in the external circulation heat-dissipation air duct B.

In an embodiment, a ventilation gap exists between the display screen 2 and the protection glass 11, and a ventilation gap exists between a side that is of the display screen 2 and that is away from the protection glass 11 and a cavity wall 15 that is of the first cavity and that is opposite to the side.

As shown in FIG. 2, in the outdoor display screen with the foregoing structure, the internal circulation heat-dissipation air duct A may cool two sides of the display screen 2, thereby improving an effect of dissipating heat of the display screen 2.

Figure 4:
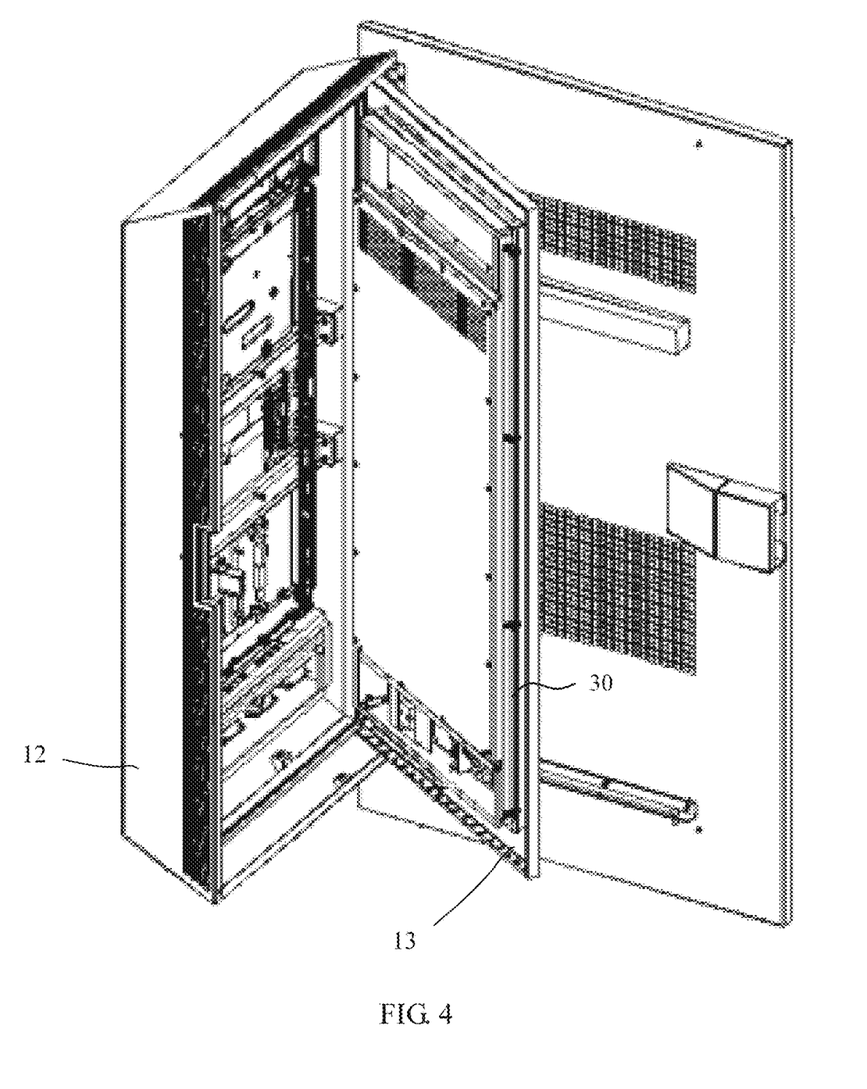
FIG. 4 is a schematic structural diagram of an outdoor display screen with the structure shown in FIG. 3 when a front cover and a baseplate in a housing are opened.

In an embodiment, as shown in FIGS. 3 and 4, the housing 1 includes a front cover 12, a baseplate 13, and a spacer 30.

The front cover 12 and the baseplate 13 are combined to form an internal cavity.

The spacer is located in the internal cavity formed by the front cover 12 and the baseplate 13 to separate space of the internal cavity into the first cavity and the second cavity. The heat dissipation module 4, the baseplate 13, and the spacer are combined to form the internal circulation path and the external circulation path.

Further, as shown in FIG. 4, in the housing 1, the baseplate 13 is mounted on the front cover 12 and may flip around a side of the baseplate 13. When the baseplate 13 is opened by flipping around the side of the baseplate 13, some function modules in the outdoor display screen may be exposed, thereby facilitating maintenance and replacement of the function modules in the outdoor display screen.

Furthermore, as shown in FIGS. 1, 3, and 4, in the housing 1, the spacer 30 includes a first sub-spacer 301 mounted on the front cover 12 and a second sub-spacer 302 mounted on the baseplate 13. As shown in FIG. 4, the display screen 2 is mounted on the first sub-spacer 301, the control module 3 is mounted on a side that is of the display screen 2 and that faces the baseplate 13, and the power supply component 5 is mounted on the baseplate 13. When the baseplate 13 is opened by flipping around the side of the baseplate 13, the display screen 2, the control module 3, and the power supply component 5 are exposed. When the baseplate 13 and the front cover 12 are closed, the first sub-spacer 301 and the second sub-spacer 302 are combined to separate the space of the internal cavity formed by closing the front cover 12 and the baseplate 13 in order to form the first cavity and the second cavity that are provided in the foregoing embodiment.

Further, as shown in FIG. 1 and FIG. 3, the first cavity is located on a side that is of the heat dissipation module 4 and that is away from the baseplate 13, and in the second cavity, the external circulation path exists on a side that is of the heat dissipation module 4 and that faces the baseplate 13, and the internal circulation path exists on the side that is of the heat dissipation module 4 and that is away from the baseplate 13.

Further, the first cavity is enclosed by the first sub-spacer, the second sub-spacer, the front cover 12, and the baseplate 13, and the second cavity is enclosed by the first sub-spacer, the second sub-spacer, the front cover 12, and the baseplate 13.

In addition, the air intake vent 20B that is disposed in the second cavity 21 and that is of the external circulation heat-dissipation air duct B may be located on the baseplate 13, and the air exhaust vent 22B is located on the front cover 12. According to the outdoor display screen with the foregoing structure, when the outdoor display screen is integrated with the enclosure 10 of the communications device, cold air can enter the external circulation heat-dissipation air duct B through a gap between the baseplate 13 and the enclosure 10 of the communications device, and hot air is blown out from a side that is of the housing 1 and that is away from the enclosure 10 of the communications device, thereby further reducing impact caused by the outdoor display screen on the communications device during heat dissipation.

Further, in the outdoor display screen, the baseplate 13 protrudes into a surrounding area of the front cover 12 to form an edge part of a ventilation gap between the baseplate 13 and the enclosure 10 of the communications device. An air vent 123 penetrating a metal sheet of the edge part to connect the external environment and the ventilation gap between the baseplate 13 and the enclosure 10 of the communications device is disposed on the edge part. By disposing the air vent 123, cold air in the external environment can enter the ventilation gap between the baseplate 13 and the enclosure 10 of the communications device, and then enter the external circulation heat-dissipation air duct B of the outdoor display screen through the air intake vent b. By disposing the edge part, a probability that dirt in the external environment enters the ventilation gap between the baseplate 13 and the enclosure 10 of the communications device can be reduced, thereby improving cleanliness in the external circulation heat-dissipation air duct B of the outdoor display screen.

In addition, a wind separation component 14 is disposed on a side that is of the baseplate 13 and that is away from the display screen 2. The wind separation component 14 is configured to separate an air intake vent 104 and air exhaust vent 103 that are disposed on the enclosure 10 of the communications device. The air intake vent b disposed on the baseplate 13 and the air intake vent 104 disposed on the enclosure 10 of the communications device are located on a same side of the wind separation component 14.

By disposing the wind separation component 14, hot air blown out through the air exhaust vent 103 disposed on the enclosure 10 of the communications device can be prevented from returning to the air intake vent 104 disposed on the enclosure 10 of the communications device and the air intake vent b disposed on the baseplate 13 of the outdoor display screen. In addition, by disposing the air vent 123 on the front cover 12, the hot air blown out through the air exhaust vent 103 disposed on the enclosure 10 of the communications device can be instantly dissipated, and cold air can instantly enter the air intake vent 104 disposed on the enclosure 10 of the communications device and the air intake vent b disposed on the baseplate 13 of the outdoor display screen. Therefore, impact caused by mounting the outdoor display screen on a heat dissipation system of the communications device can be further reduced.

Figure 5:
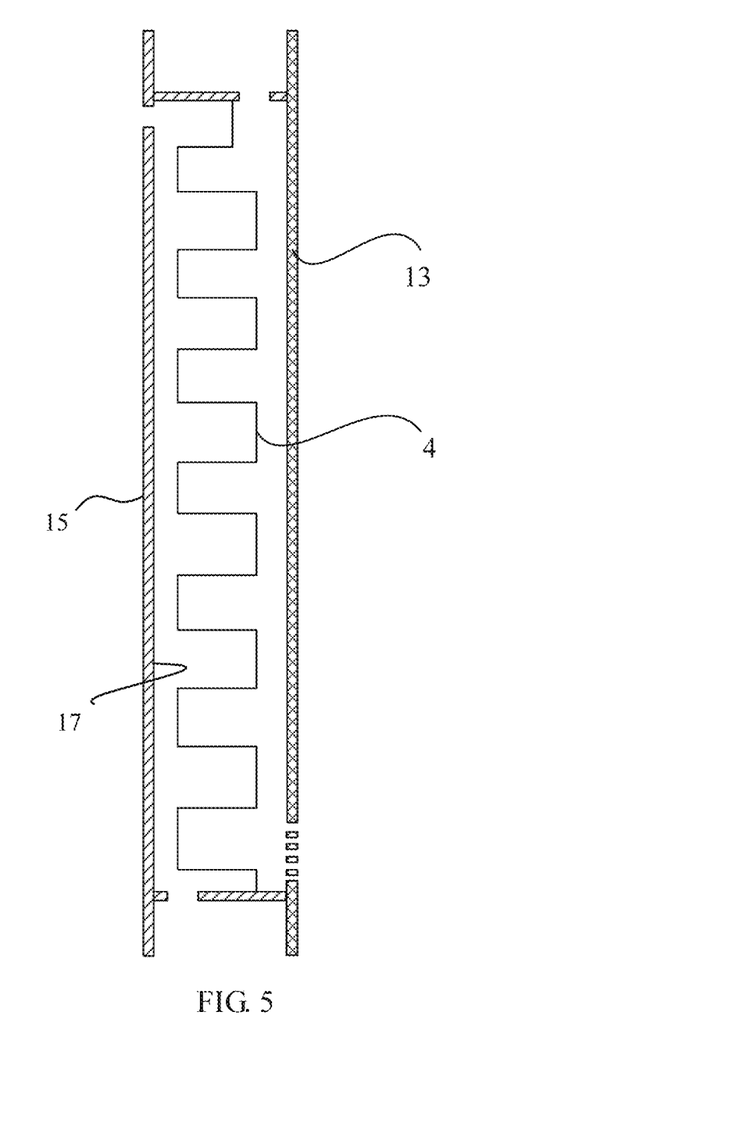
FIG. 5 is a schematic structural diagram of a heat dissipation module in an outdoor display screen according to an embodiment of the present application.

Further, as shown in FIGS. 1, 2 and 5, the heat dissipation module 4 is a heat exchange fin. A surrounding area 27 of the heat exchange fin and a cavity wall 17 within the second cavity 21 are combined and sealed to separate an internal space of the second cavity 21 into the internal circulation path 23 and the external circulation path 25.

Further, as shown in FIG. 5, the heat exchange fin has a detour structure. Therefore, heat exchange area of air between the heat exchange fin and the external circulation path and heat exchange area of air between the heat exchange fin and the internal circulation path can be increased.

Based on the foregoing embodiments, as shown in FIG. 3, in an embodiment, on two opposite and parallel sides of the housing 1, a hinge 121 configured to hinge the enclosure 10 of the communications device is disposed on one side, and a lock-up mechanism 122 configured to lock the enclosure 10 of the communications device is disposed on the other side. Likewise, a corresponding structure is disposed on the enclosure 10 of the communications device, for example, a lock 101 shown in FIG. 3.

When the outdoor display screen with the foregoing structure is integrated with the enclosure 10 of the communications device, an operation such as maintenance can be performed on the outdoor display screen, provided that a lock-up relationship between the lock 101 and the lock-up mechanism 122 is unbound.

In addition, the outdoor display screen further includes a door-open maintenance support bar 102. When the housing 1 of the outdoor display screen is opened, the enclosure 10 of the communications device is supported by one end of the door-open maintenance support bar 102, and the housing 1 of the outdoor display screen is supported by the other end in order to keep the outdoor display screen in an open state.

In another embodiment, the housing 1 is fixed on the enclosure 10 of the communications device. Further, the outdoor display screen is fixed on a cabinet door of the communications device.

In addition, an embodiment of the present application further provides a communications device, including an enclosure 10, a power distribution component, a communications component, and a heat dissipation system, where the power distribution component, the communications component, and the heat dissipation system are located in the enclosure. The communications device further includes any outdoor display screen that is provided in the foregoing embodiments, located on an outer side of the enclosure 10, and integrated with the enclosure 10.

Obviously, a person skilled in the art can make various modifications and variations to embodiments of the present application without departing from the scope of the present application. The present application is intended to cover these modifications and variations provided that they fall within the scope of protection defined by the following claims and their equivalent technologies.

What is claimed is:

1. An outdoor display screen, comprising:
a housing comprising a baseplate;
a first cavity and a second cavity being disposed in the housing, the housing being mounted on an enclosure of a communications device;
a display screen being mounted in the first cavity;
a control module being mounted in the first cavity;
a heat dissipation module; and
a power supply component being mounted in the second cavity,
a display window opposite to an out-light surface of the display screen being disposed on the housing,
a protection glass being disposed on the display window,
the heat dissipation module being mounted in the second cavity to form, in the second cavity, an internal circulation path and an external circulation path separated from each other,
a cable-through hole being disposed on the housing,
the cable-through hole being used by a power cable and a communications cable to pass through to enable the display screen, the control module, and the power supply component to be coupled to a power interface and a communications interface in the enclosure of the communications device,
a first air exhaust vent coupled to a first air intake vent of the internal circulation path, the first air intake vent of the internal circulation path being disposed between the first cavity and the second cavity to form a portion of an internal circulation heat-dissipation air duct, and
a second air intake vent coupled to a second air exhaust vent of the external circulation path and an external environment, the second air intake vent being disposed on the baseplate to form a portion of an external circulation heat-dissipation air duct separated from the internal circulation heat-dissipation air duct.

2. The outdoor display screen of claim 1, further comprising:
an internal circulation fan set mounted in the internal circulation heat-dissipation air duct; and
an external circulation fan set mounted in the external circulation heat-dissipation air duct.

3. The outdoor display screen of claim 1, wherein a ventilation gap exists between the display screen and the protection glass, and another ventilation gap exists between a side of the display screen that is away from the protection glass and a cavity wall of the first cavity that is opposite to the side.

4. The outdoor display screen of claim 1, wherein the housing comprises:

a front cover; and
a spacer, the front cover and the baseplate combining to form an internal cavity, the spacer being located in the internal cavity, and the front cover, the baseplate and the spacer combining to provide the internal circulation path and the external circulation path.

5. The outdoor display screen of claim 4, wherein the baseplate is mounted on the front cover and is configured to flip around a side of the baseplate.

6. The outdoor display screen of claim 5, wherein the spacer comprises:
a first sub-spacer coupled to the front cover; and
a second sub-spacer coupled to the baseplate, the display screen being mounted on the first sub-spacer, the control module being mounted on a side of the display screen facing the baseplate, the power supply component being mounted on the baseplate, each of the display screen, the control module, and the power supply component being exposed when the baseplate is opened by flipping around the side of the baseplate, and when the baseplate and the front cover are closed, the first sub-spacer and the second sub-spacer couple to provide a bottom portion enclosing the internal cavity formed by closing the front cover and the baseplate.

7. The outdoor display screen of claim 6, wherein the first cavity is located on a side of the heat dissipation module away from the baseplate, the external circulation path existing on a side of the heat dissipation module facing the baseplate in the second cavity and the internal circulation path existing on the side of the heat dissipation module away from the baseplate.

8. The outdoor display screen of claim 7, wherein the first cavity is enclosed by the first sub-spacer, the second sub-spacer, the front cover, and the baseplate, and the second cavity is enclosed by the first sub-spacer, the second sub-spacer, the front cover, and the baseplate.

9. The outdoor display screen of claim 8, wherein the second air exhaust vent disposed outside the second cavity is located on the front cover, and the second air intake vent disposed outside the second cavity is located on the baseplate.

10. The outdoor display screen of claim 9, wherein the baseplate protrudes into a surrounding area of the front cover to form an edge part of a ventilation gap between the baseplate and the enclosure of the communications device, and an air vent penetrating a metal sheet of the edge part to connect the external environment and the ventilation gap between the baseplate and the enclosure of the communications device is disposed on the edge part.

11. The outdoor display screen of claim 10, wherein a wind separation component is disposed immediately adjacent a side of the baseplate, the wind separation component being configured to separate a third air intake vent and a third air exhaust vent that are disposed on the enclosure of the communications device, and the second air intake vent disposed on the baseplate and the third air intake vent disposed on the enclosure of the communications device are located on a same side of the wind separation component.

12. The outdoor display screen of claim 1, wherein the heat dissipation module is a heat exchange fin, and the heat exchange fin separates an internal space of the second cavity into the internal circulation path and the external circulation path.

13. The outdoor display screen of claim 1, wherein a hinge is disposed on one side of the housing and is configured to swing the enclosure of the communications device, and a lock-up mechanism disposed on an opposite side of the housing is configured to lock the enclosure of the communications device.

14. The outdoor display screen of claim 1, wherein the housing is fixed on the enclosure of the communications device.

15. A communications device, comprising:
an enclosure;
a power distribution component;
an outdoor display screen;
a communications component; and
a heat dissipation system;
the power distribution component, the communications component, and the heat dissipation system being located in the enclosure, the outdoor display screen being located on an outer side of the enclosure and integrated with the enclosure and comprising:
a housing comprising a baseplate;
a first cavity and a second cavity being disposed in the housing;
a display screen being mounted in the first cavity;
a control module being mounted in the first cavity;
a heat dissipation module; and
a power supply component being mounted in the second cavity,
a display window opposite to an out-light surface of the display screen being disposed on the housing,
a protection glass being disposed on the display window,
the heat dissipation module being mounted in the second cavity to form, in the second cavity, an internal circulation path and an external circulation path that are separated from each other,
a cable-through hole being disposed on the housing, the cable-through hole being used by a power cable and a communications cable to pass through to enable the display screen, the control module, and the power supply component to couple to a power interface and a communications interface in the enclosure of the communications device,
a first air exhaust vent coupled to a first air intake vent of the internal circulation path, the first air intake vent of the internal circulation path being disposed between the first cavity and the second cavity to form a portion of an internal circulation heat-dissipation air duct, and
a second air intake vent coupled to a second air exhaust vent of the external circulation path and an external environment, the second air intake vent being disposed on the baseplate to form a portion of an external circulation heat-dissipation air duct separated from the internal circulation heat-dissipation air duct.

16. The communications device of claim 15, further comprising:
an internal circulation fan set mounted in the internal circulation heat-dissipation air duct; and
an external circulation fan set mounted in the external circulation heat-dissipation air duct.

17. The communications device of claim 15, wherein a ventilation gap exists between the display screen and the protection glass, and another ventilation gap exists between a side of the display screen away from the protection glass and a cavity wall of the first cavity opposite to the side.

18. The communications device of claim 15, wherein the housing comprises:
a front cover; and
a spacer, the front cover and the baseplate combining to form an internal cavity, the spacer being located in the internal cavity, and the front cover, the baseplate and the spacer combining to provide the internal circulation path and the external circulation path.

19. The communications device of claim 18, wherein the baseplate is mounted on the front cover and is configured to flip around a side of the baseplate.

20. The communications device of claim 19, wherein the spacer comprises:
a first sub-spacer coupled to the front cover; and
a second sub-spacer coupled to the baseplate, the display screen being mounted on the first sub-spacer, the control module being mounted on a side of the display screen facing the baseplate, the power supply component being mounted on the baseplate, each of the display screen, the control module, and the power supply component being exposed when the baseplate is opened by flipping around the side of the baseplate, and when the baseplate and the front cover are closed, the first sub-spacer and the second sub-spacer coupling together to provide a bottom portion enclosing the internal cavity.

* * * * *